(12) United States Patent
Liang et al.

(10) Patent No.: US 11,239,257 B2
(45) Date of Patent: Feb. 1, 2022

(54) DISPLAY BACKPLANE AND METHOD FOR MANUFACTURING THE SAME, DISPLAY PANEL AND DISPLAY DEVICE

(71) Applicant: BOE TECHNOLOGY GROUP CO., LTD., Beijing (CN)

(72) Inventors: Zhiwei Liang, Beijing (CN); Yingwei Liu, Beijing (CN); Haixu Li, Beijing (CN); Muxin Di, Beijing (CN); Qingzhao Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 142 days.

(21) Appl. No.: 16/468,240

(22) PCT Filed: Jan. 9, 2019

(86) PCT No.: PCT/CN2019/071004
§ 371 (c)(1),
(2) Date: Jun. 10, 2019

(87) PCT Pub. No.: WO2019/237731
PCT Pub. Date: Dec. 19, 2019

(65) Prior Publication Data
US 2020/0411566 A1    Dec. 31, 2020

(30) Foreign Application Priority Data

Jun. 14, 2018 (CN) .......................... 201810611465.9

(51) Int. Cl.
*H01L 27/12* (2006.01)
*H01L 29/786* (2006.01)

(52) U.S. Cl.
CPC ........ *H01L 27/1222* (2013.01); *H01L 27/127* (2013.01); *H01L 29/7869* (2013.01); *H01L 29/78618* (2013.01)

(58) Field of Classification Search
CPC ............ H01L 27/1251; H01L 27/3276; H01L 27/1222; H01L 27/127; H01L 29/78618;
(Continued)

(56) References Cited

U.S. PATENT DOCUMENTS

2009/0127556 A1\* 5/2009 Takayama ........... H01L 27/3244
257/59

FOREIGN PATENT DOCUMENTS

CN    105633099 A    6/2016
CN    107248521 A    10/2017
(Continued)

OTHER PUBLICATIONS

First Office Action for CN Appl. No. 201810611465.9, dated Jun. 10, 2019.
(Continued)

*Primary Examiner* — Thanh Y. Tran
(74) *Attorney, Agent, or Firm* — The Webb Law Firm (57) ABSTRACT

The present disclosure provides a display backplane and a method for manufacturing the same, a display panel and a display device, and relates to the field of display technology. The display backplane includes a first backplane and a second backplane. The first backplane includes a first substrate, and a first thin film transistor, on the first substrate, configured to drive a light emitting unit. The second backplane, which is attached to a surface of the first substrate facing away from the first thin film transistor, includes a second substrate and at least one second thin film transistor located between the second substrate and the first substrate.

20 Claims, 9 Drawing Sheets (58) Field of Classification Search
CPC ............. H01L 29/7869; H01L 27/1214; H01L 2021/775
See application file for complete search history.

(56) References Cited

FOREIGN PATENT DOCUMENTS

| | | |
|---|---|---|
| CN | 107403804 A | 11/2017 |
| CN | 107579056 A | 1/2018 |
| CN | 108831892 A | 11/2018 |

OTHER PUBLICATIONS

International Search Report and Written Opinion for International Appl. No. PCT/CN2019/071004, dated Apr. 9, 2019.

\* cited by examiner

DISPLAY BACKPLANE AND METHOD FOR MANUFACTURING THE SAME, DISPLAY PANEL AND DISPLAY DEVICE

CROSS-REFERENCE TO RELATED APPLICATIONS

The present application is a U.S. National Stage Application under 35 U.S.C. § 371 of International Patent Application No. PCT/CN2019/071004, filed on Jan. 9, 2019, which claims priority to Chinese Patent Application No. 201810611465.9, filed on Jun. 14, 2018, the disclosures of both of which are incorporated by reference herein in their entirety.

TECHNICAL FIELD

The present disclosure relates to the technical field of display, and especially to a display backplane and a method for manufacturing the same, a display panel and a display device.

BACKGROUND

In order to reduce the flow of the manufacturing process and improve the integration of the display panel, the gate driving circuit may be directly fabricated on the display backplane (also referred to as an array substrate) by Gate On Array (GOA) technology.

SUMMARY

According to one aspect of embodiments of the present disclosure, a display backplane is provided. The display backplane comprises a first backplane and a second backplane. The first backplane comprises a first substrate, and a first thin film transistor, on the first substrate, configured to drive a light emitting unit. The second backplane, which is attached to a surface of the first substrate facing away from the first thin film transistor, comprises a second substrate and at least one second thin film transistor located between the second substrate and the first substrate.

In some embodiments, a material of an active layer of the first thin film transistor is different from a material of an active layer of the at least one second thin film transistor.

In some embodiments, the material of the active layer of the first thin film transistor comprises an oxide semiconductor, and the material of the active layer of the at least one second thin film transistor comprises a polysilicon.

In some embodiments, the first substrate comprises a first substrate layer and a first connecting member penetrating through the first substrate layer; and a gate of the first thin film transistor is connected to a drain of one of the at least one second thin film transistor via the first connecting member.

In some embodiments, the first substrate further comprises an insulating protective layer located on one side of the first substrate layer facing away from the first thin film transistor, and the second backplane further comprises a planarization layer on one side of the at least one second thin film transistor facing away from the second substrate; and the first connecting member is connected to the drain via a contact electrode penetrating through the insulating protective layer and the planarization layer.

In some embodiments, the first substrate comprises a first substrate layer and a second connecting member penetrating through the first substrate layer; and a source of the first thin film transistor is connected to a drain of one of the at least one second thin film transistor via the second connecting member.

In some embodiments, the first substrate further comprises an insulating protective layer located on one side of the first substrate layer facing away from the first thin film transistor, and the second backplane further comprises a planarization layer on one side of the at least one second thin film transistor facing away from the second substrate; and the second connecting member is connected to the drain via a contact electrode penetrating through the insulating protective layer and the planarization layer.

In some embodiments, the second substrate comprises a second substrate layer and a plurality of connecting members penetrating through the second substrate layer; and one or more of the at least one second thin film transistor are connected to an external circuit via the plurality of connecting members.

In some embodiments, the plurality of connecting members is disposed at a peripheral region of the second substrate layer.

In some embodiments, the at least one second thin film transistor is comprised in a driving circuit.

In some embodiments, the driving circuit comprises at least one of a gate driving circuit or a source driving circuit.

In some embodiments, the first substrate comprises a first substrate layer, and a first connecting member and a second connecting member that penetrate through the first substrate layer; and a gate of the first thin film transistor is connected to a drain of one of the at least one second thin film transistor via the first connecting member, and a source of the first thin film transistor is connected to a drain of another one of the at least one second thin film transistor via the second connecting member.

In some embodiments, the one of the at least one second thin film transistor is comprised in a gate driving circuit, and the another one of the at least one second thin film transistor is comprised in a source driving circuit.

In some embodiments, the first substrate further comprises an insulating protective layer located on one side of the first substrate layer facing away from the first thin film transistor, and the second backplane further comprises a planarization layer on one side of the at least one second thin film transistor facing away from the second substrate; and the first connecting member is connected to the drain of the one of the at least one second thin film transistor via one contact electrode penetrating through the insulating protective layer and the planarization layer, and the second connecting member is connected to the drain of the another one of the at least one second thin film transistor via another contact electrode penetrating through the insulating protective layer and the planarization layer.

According to another aspect of embodiments of the present disclosure, a display panel is provided. The display panel comprises: the display backplane according to any one of the above embodiments.

According to still another aspect of embodiments of the present disclosure, a display device is provided. The display device comprises: the display panel according to any one of the above embodiments.

According to yet still another aspect of embodiments of the present disclosure, a method for manufacturing a display backplane is provided. The method comprises: forming a first backplane, comprising forming, on a first substrate, a first thin film transistor configured to drive a light emitting unit; forming a second backplane, comprising forming at least one second thin film transistor on a second substrate;

and attaching the second backplane to a surface of the first substrate facing away from the first thin film transistor, wherein after the attaching, the at least one second thin film transistor is located between the second substrate and the first substrate.

In some embodiments, a material of an active layer of the first thin film transistor is different from a material of an active layer of the second thin film transistor.

In some embodiments, the first substrate comprises a first substrate layer, a connecting member penetrating through the first substrate layer, and an insulating protective layer located on one side of the first substrate layer facing away from the first thin film transistor, wherein the connecting member is connected to one of a gate and a source of the first thin film transistor; the second backplane further comprises a planarization layer on one side of the at least one second thin film transistor facing away from the second substrate and a contact electrode penetrating through the planarization layer, wherein the contact electrode is in contact with a drain of one of the at least one second thin film transistor;

the attaching comprises: forming an opening at a position of the insulating protective layer corresponding to the connecting member to expose at least a part of the connecting member; aligning the contact electrode with the connecting member; and applying a pressure to at least one of the first backplane or the second backplane to make the contact electrode contact and bond with the connecting member.

In some embodiments, a material of the contact electrode comprises Sn—Ag—Cu alloy or In—Sn alloy; the applying comprises: applying the pressure of less than 100 kPa within a temperature ranging from 160° C. to 200° C.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure can be understood more clearly from the following detailed description with reference to the accompanying drawings, in which.

It should be understood that the dimensions of the various parts shown in the accompanying drawings are not necessarily drawn according to the actual scale. In addition, the same or similar reference signs are used to denote the same or similar components.

DETAILED DESCRIPTION

Various exemplary embodiments of the present disclosure will now be described in detail with reference to the accompanying drawings. The following description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "have" or variants thereof means that the element before the word covers the element(s) listed after the word without excluding the possibility of also covering other elements. The terms "up", "down", or the like are used only to represent a relative positional relationship, and the relative positional relationship may be changed correspondingly if the absolute position of the described object changes.

In the present disclosure, when it is described that a specific component is disposed between a first component and a second component, there may be an intervening component between the specific component and the first component or between the specific component and the second component. When it is described that a specific part is connected to other parts, the specific part may be directly connected to the other parts without an intervening part, or not directly connected to the other parts with an intervening part.

Unless otherwise defined, all terms (comprising technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

The inventors have noted that, in some cases, since a material of the active layer of the thin film transistor (TFT) configured to drive the light emitting unit may be different from that of the active layer of the thin film transistor of the gate driving circuit, it is necessary to form the two types of thin film transistors by different process flows.

The inventors have found that, the performance of one of the two types of thin film transistors that has been formed might be adversely affected by one or more steps in the process flow of forming the other thin film transistor might adversely affect.

Embodiments of the present disclosure provide a technical solution of a display backplane capable of avoiding an adverse effect in the process of forming one of a first thin film transistor configured to drive a light emitting unit and a second thin film transistor on the other thin film transistor.

Figure 1:
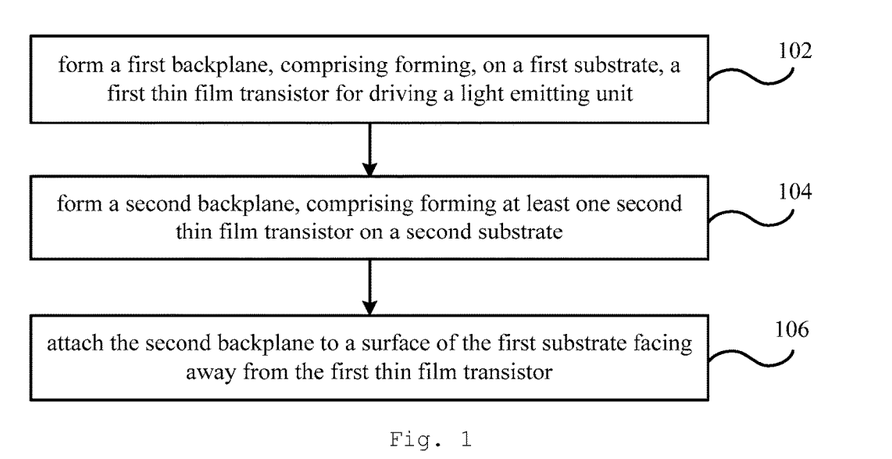
FIG. 1 is a schematic flow chart showing a method for manufacturing a display backplane according to an embodiment of the present disclosure.

FIG. 1 is a schematic flow chart showing a method for manufacturing a display backplane according to an embodiment of the present disclosure.

At step 102, a first backplane is formed.

Here, the step of forming a first backplane comprises forming a first thin film transistor, on the first substrate, configured to drive a light emitting unit. The light emitting unit may be, for example, an organic light emitting diode (OLED). The light emitting unit emits light under the driving of the first thin film transistor. It should be understood that, the step of forming the first backplane may also comprise forming other components such as an anode.

At step 104, a second backplane is formed.

Here, the step of forming a second backplane comprises forming at least one second thin film transistor on the second substrate. In some embodiments, the at least one second thin film transistor is comprised in a driving circuit. For example, the at least one second thin film transistor constitutes a driving circuit or a part of a driving circuit. In some embodiments, the driving circuit comprises at least one of a gate driving circuit or a source driving circuit. However, the present disclosure is not limited thereto, and for example, the at least one second thin film transistor may also be comprised in another circuit. Besides, it should be understood that, the step of forming a second backplane may also comprise forming other components of the driving circuit.

In some embodiments, a material of the active layer of the second thin film transistor is different from that of the active layer of the first thin film transistor. For example, the material of the active layer of the first thin film transistor comprises an oxide semiconductor, such as indium gallium zinc oxide (IGZO); and the material of the active layer of the second thin film transistor comprises a polysilicon. In a case where the material of the active layer of the first thin film transistor comprises an oxide semiconductor, it is possible to achieve low frequency driving of a pixel and reduce power consumption of a display panel. However, the present disclosure is not limited thereto. In other embodiments, the material of the active layer of the second thin film transistor and the material of the active layer of the first thin film transistor may be the same, for example, each may be a polysilicon or an oxide semiconductor.

At step 106, the second backplane is attached (for example, adhered, bonded, or the like) to a surface of the first substrate facing away from the first thin film transistor. After the second backplane is attached, the second thin film transistor is located between the second substrate and the first substrate.

For example, the first substrate comprises a first surface and a second surface opposite to the first surface. The first thin film transistor is on the first surface, and the second backplane is attached to the second surface.

In the above embodiments, the first backplane and the second backplane are independently formed respectively, and then attached together to form a display backplane. Such method makes the process flow for forming the first thin film transistor and the process flow for forming the second thin film transistor not affect each other, thereby avoiding the process of forming the first thin film transistor adversely affecting the performance of the second thin film transistor, and also avoiding the process of forming the second thin film transistor adversely affecting the performance of the first thin film transistor. The yield of the display backplane is improved.

FIGS. 2A-2I are cross-sectional schematic views showing structures formed at different stages of forming a first backplane according to some implementations of the present disclosure.

The process of forming the first backplane will be described in detail below with reference to FIGS. 2A-2I.

Figure 2A:
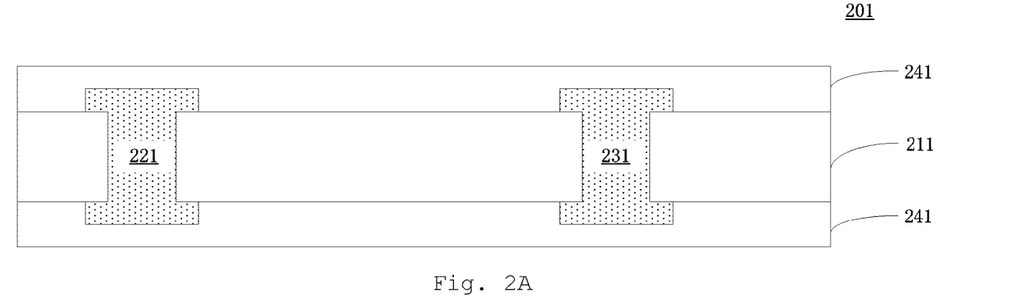
FIGS. 2A-2I are cross-sectional schematic views showing structures formed at different stages of forming a first backplane according to some implementations of the present disclosure.

First, as shown in FIG. 2A, a first substrate 201 is provided.

In some embodiments, the first substrate 201 comprises a first substrate layer 211, such as a glass layer. In some embodiments, the first substrate 201 has a connecting member penetrating through the first substrate layer 211, such as the first connecting member 221 or the second connecting member 231. The first connecting member 221 and the second connecting member 231 may each be, for example, a metal connecting member such as a copper member. In some embodiments, the first substrate 201 may further comprise insulating protective layers 241 on the upper and lower surfaces of the first substrate layer 211 and covering the connecting member(s) in the first substrate 201. The insulating protective layer 241 serves to prevent the connecting member in the first substrate 201 from oxidizing, and may protect the first substrate layer 211.

In one or more embodiments, the first substrate 201 may be formed by a TGV (Through Glass Via) technology. In this case, the first substrate 201 may also be referred to as a TGV substrate 201. For example, the first substrate layer 211 is punched first, for example punched by laser, to form a via having a diameter of, for example, about several tens of micrometers to 100 micrometers. Then, a metal material such as copper or the like is formed (for example, electroplated) in the via to form a connecting member such as the first connecting member 221 or the second connecting member 231. Thereafter, an insulating protective layer 241 such as an oxide of silicon layer or an organic material layer covering the connecting member may also be formed on the upper and lower surfaces of the first substrate layer 211.

Figure 2B:
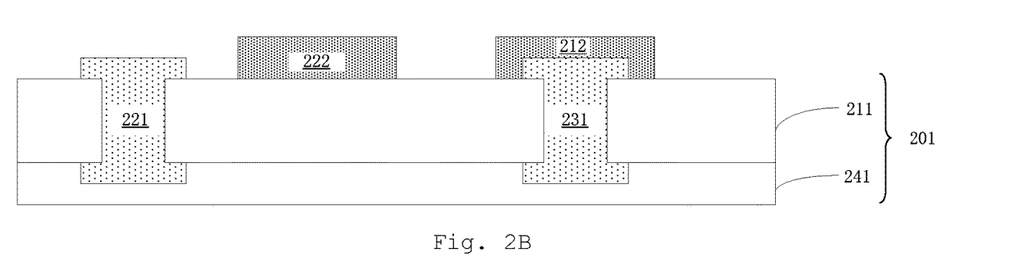

Then, as shown in FIG. 2B, a source 212 and a drain 222 are formed on the first substrate 201. The source 212 is in contact with the second connecting member 231, and the drain 222 is located on the first substrate layer 211.

It should be noted that, in a case where the first substrate 201 has the insulating protective layer 241, the insulating protective layer 241 on one of the upper and lower surfaces of the first substrate layer 211 may be removed first, and then the source 212 and the drain 222 are formed.

Figure 2C:
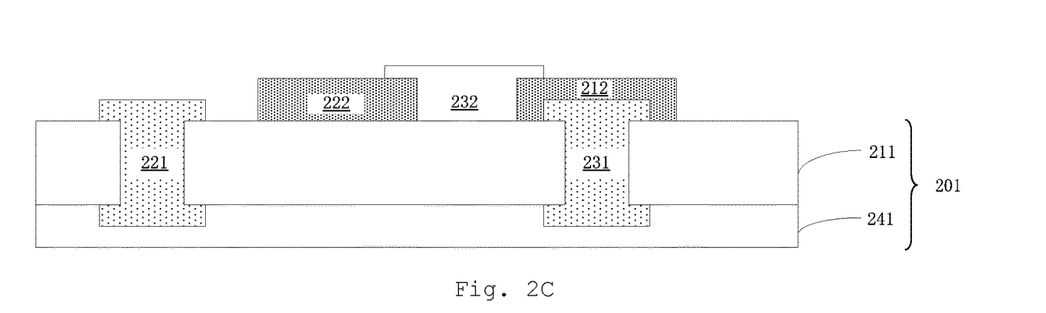

Then, as shown in FIG. 2C, an active layer 232 such as an oxide semiconductor layer is formed. The active layer 232 is in contact with the source 212 and the drain 222 respectively.

Figure 2D:
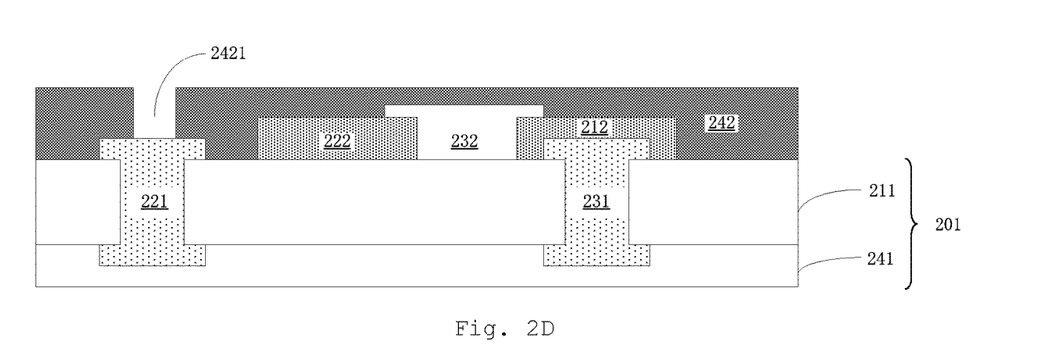

Thereafter, as shown in FIG. 2D, a gate insulating layer 242 is formed on the structure shown in FIG. 2C. The gate insulating layer 242 defines an opening 2421 that exposes at least a part of the first connecting member 221.

Figure 2E:
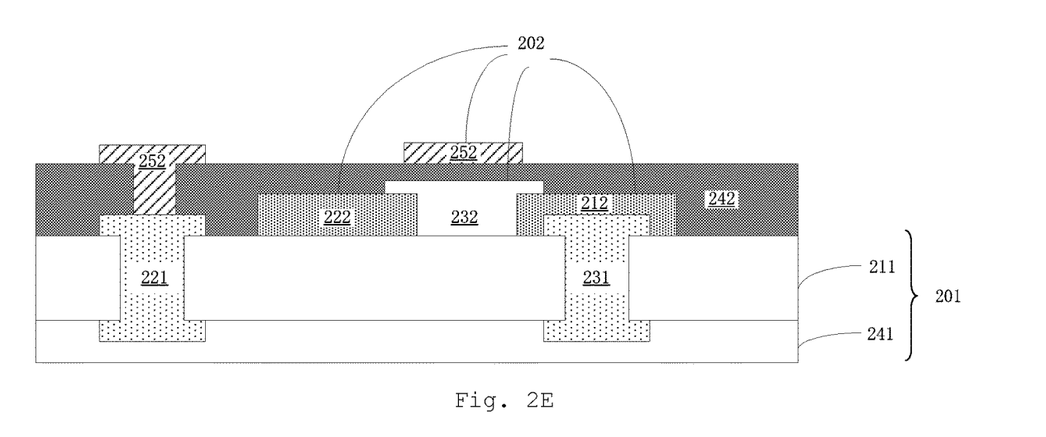

Next, as shown in FIG. 2E, a gate 252 is formed. Here, the gate 252 is connected to the first connecting member 221. For example, a part of the gate 252 is located on the gate insulating layer 242, and the other part of the gate 252 fills the opening 2421 and is in contact with the first connecting member 221.

After the gate 252 is formed, the first thin film transistor 202 comprising the source 212, the drain 222, the gate insulating layer 242 and the gate 252 is formed.

Figure 2F:
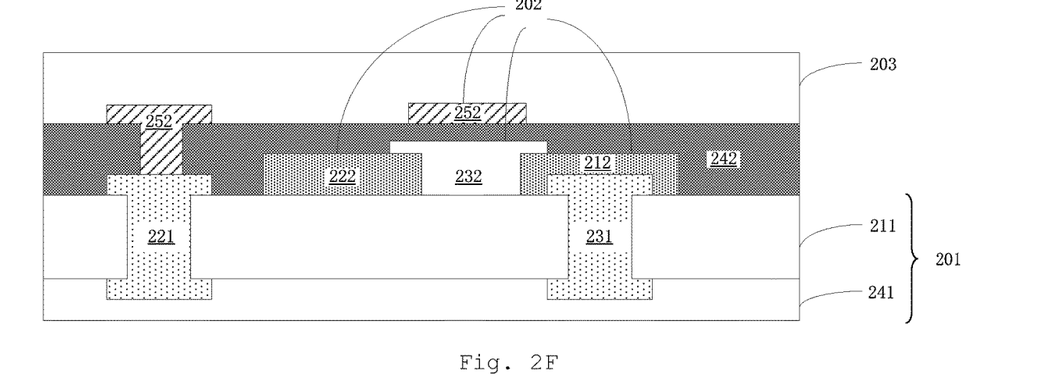

Thereafter, as shown in FIG. 2F, a planarization layer 203 such as a resin material layer may also be formed on the structure shown in FIG. 2E.

Figure 2G:
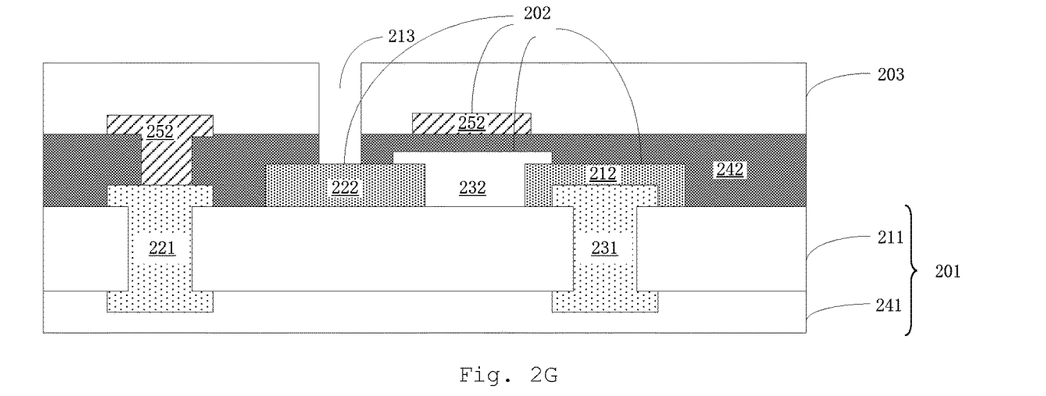

Thereafter, as shown in FIG. 2G, a via 213 penetrating through the planarization layer 203 and the gate insulating layer 242 is formed to expose at least a part of the drain electrode 222.

In some embodiments, a first via penetrating through the gate insulating layer 242 may be formed first after the gate insulating layer 242 is formed, and then a second via communicating with the first via may be then formed after the planarization layer 203 is formed, thus the via 213 penetrating through the planarization layer 203 and the gate insulating layer 242 is obtained.

Figure 2H:
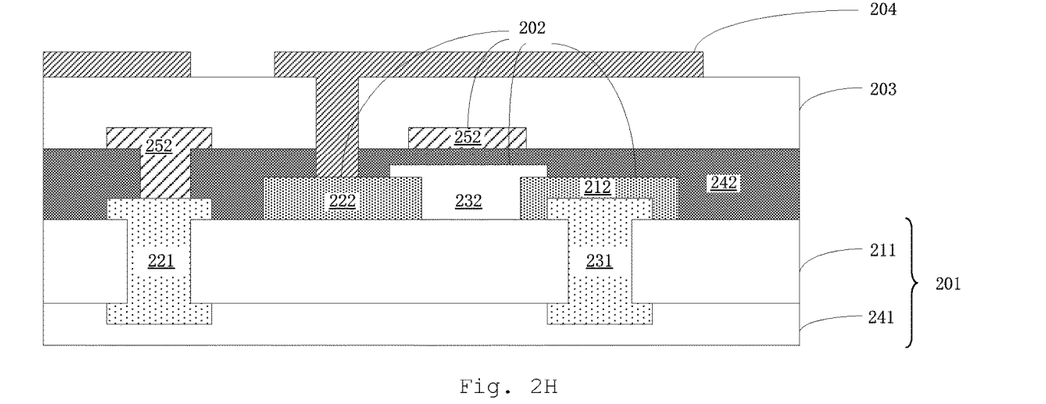

Thereafter, as shown in FIG. 2H, an anode 204 is formed on the planarization layer 203. In some embodiments, the via 213 may be filled with the anode 204 to connect the anode 204 to the drain 222.

In some implementations, the material of the anode 204 may be indium tin oxide (ITO). In other implementations, the anode 204 may be a stack comprising two ITO layers and Ag therebetween.

Figure 2I:
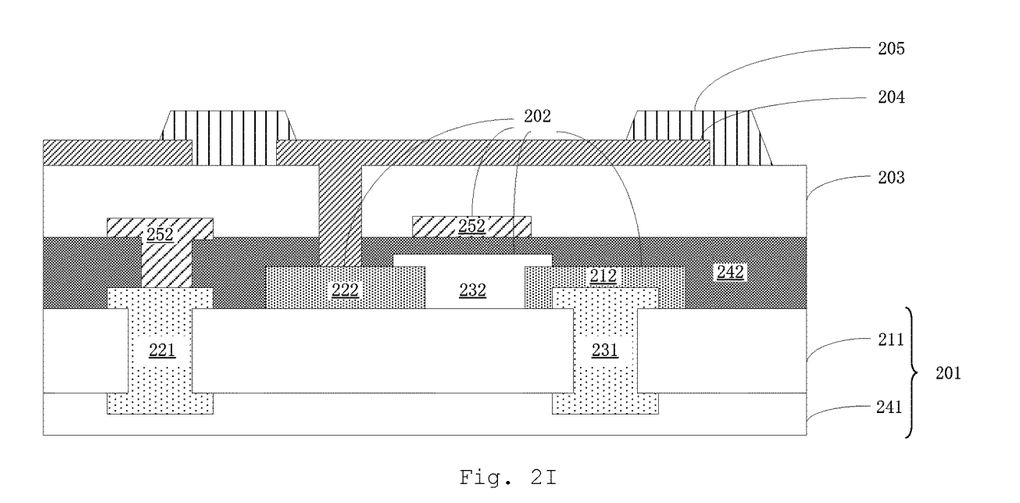

Thereafter, as shown in FIG. 2I, a pixel defining layer (PDL) 205 may be formed on the structure shown in FIG. 2H. Further, in some embodiments, a photoresist supporting layer (not shown) may also be formed on the PDL 205.

The first backplane may be formed according to the flow shown in FIGS. 2A-2I, and the first backplane is referred to as the first backplane 200 below.

FIGS. 3A-3I are cross-sectional schematic views showing structures formed at different stages of forming a second backplane according to some implementations of the present disclosure.

The process of forming the second backplane will be described in detail below with reference to FIGS. 3A-3I.

Figure 3A:
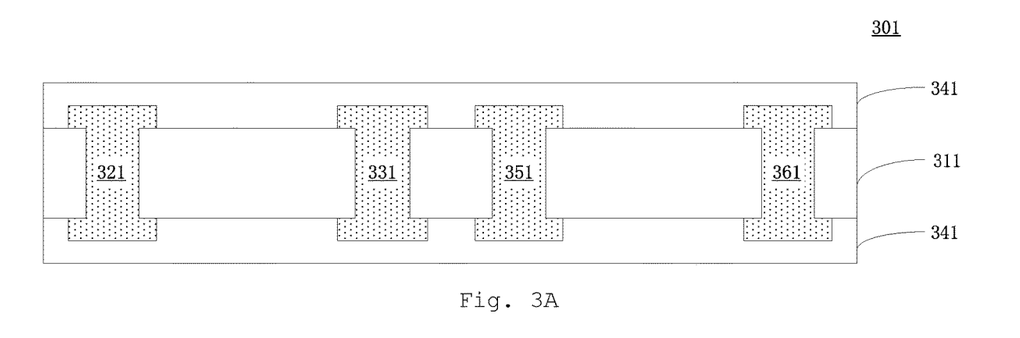
FIGS. 3A-3I are cross-sectional schematic views showing structures formed at different stages of forming a second backplane according to some implementations of the present disclosure.

First, as shown in FIG. 3A, a second substrate 301 is provided.

In some embodiments, the second substrate 301 comprises a second substrate layer 311, such as a glass layer. In some embodiments, the second substrate 301 has a plurality of connecting members penetrating through the second substrate layer 311. The plurality of connecting members may comprise a third connecting member 321 and a fourth connecting member 331. In some embodiments, the plurality of connecting members may further comprise a fifth connecting member 351 and a sixth connecting member 361 that penetrate through the second substrate layer 311. The plurality of connecting members may be, for example, metal connecting members such as copper member. In some embodiments, the second substrate 301 may further comprise insulating protective layers 341 located on the upper and lower surfaces of the second substrate layer 311 and covering the plurality of connecting members. The insulating protective layer 341 prevents the plurality of connecting members from oxidizing and protects the second substrate layer 311.

In one or more embodiments, the second substrate 301 may be formed by the TGV technology given above. In this case, the second substrate 301 may also be referred to as a TGV substrate 301.

Figure 3B:
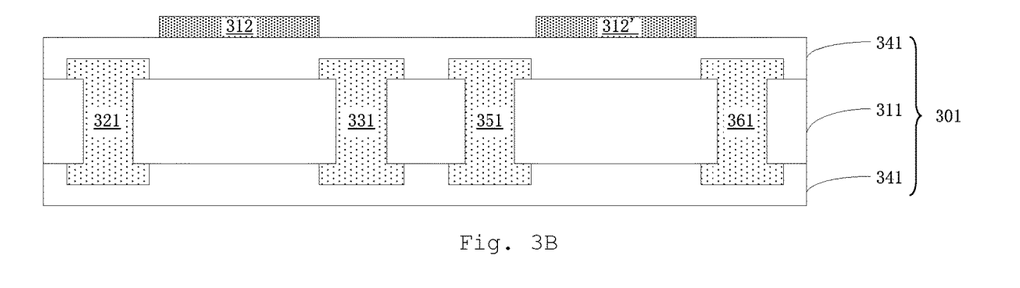

Next, as shown in FIG. 3B, an active layer 312 is formed on the insulating protective layer 341 on a surface of the second substrate layer 311. The active layer 312 may be, for example, an active layer of a second thin film transistor of a gate driving circuit. In some embodiments, an active layer of another thin film transistor such as an active layer 312' of a second thin film transistor of a source driver circuit may be simultaneously formed when the active layer 312 is formed.

In some embodiments, a polysilicon layer may be formed as the active layer 312 or the active layer 312' by a Low Temperature Poly-silicon (LTPS) technology. For example, amorphous silicon may be formed first on the insulating protective layer 341, and then be crystallized into polysilicon by technologies such as excimer laser annealing (ELA). In some examples, an excimer laser of an ultraviolet wave band may be irradiated on the surface of the amorphous silicon. The amorphous silicon may be heated rapidly after absorbing light of the ultraviolet wave band, and may further be gradually melted. Thereafter, polysilicon may be gradually formed from the molten silicon as the heat is gradually released.

Figure 3C:
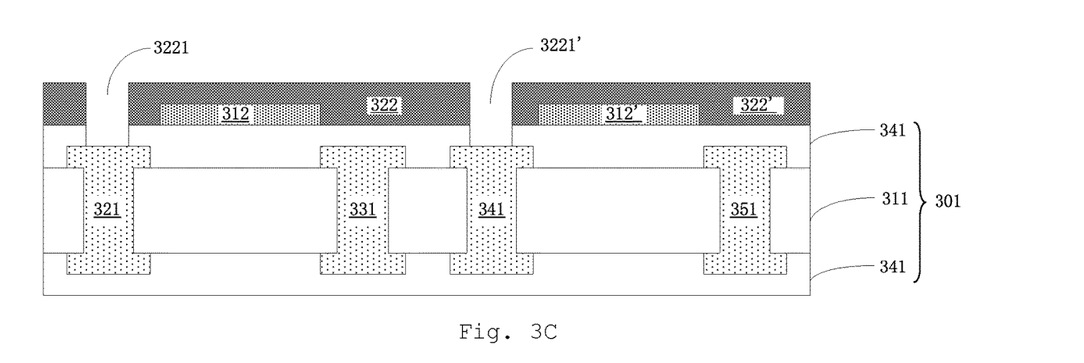

Then, as shown in FIG. 3C, agate insulating layer 322 covering the active layer 312 is formed. The gate insulating layer 322 defines an opening 3221 that exposes at least a part of the third connecting member 321.

In some embodiments, a gate insulating layer 322' covering the active layer 312' may also be formed. The gate insulating layer 322' defines an opening 3221' that exposes at least a part of the fifth connecting member 341. In some embodiments, the gate insulating layer 322 and the gate insulating layer 322' may be formed simultaneously. In other embodiments, the gate insulating layer 322 and the gate insulating layer 322' may also be formed independently.

Figure 3D:
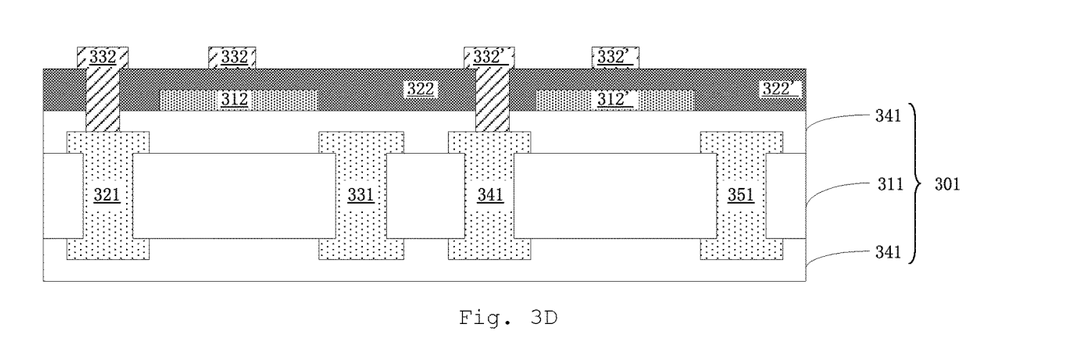

Thereafter, as shown in FIG. 3D, agate electrode 332 is formed. Here, the gate 332 is connected to the third connecting member 321. For example, a part of the gate 332 is located on the gate insulating layer 322, and the other part of the gate 332 fills the opening 3221 and is in contact with the third connecting member 321.

In some embodiments, a gate 332' may also be formed. Here, the gate 332' is connected to the fifth connecting member 341. For example, a part of the gate 332' is located on the gate insulating layer 322', and the other part of the gate 332' fills the opening 3221' and is in contact with the fifth connecting member 341.

Figure 3E:
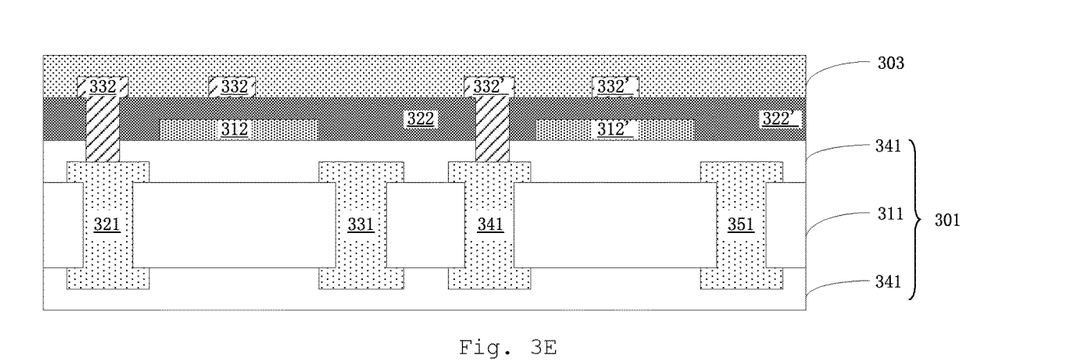

Thereafter, as shown in FIG. 3E, an interlayer dielectric layer 303 covering the gate electrode 332, for example an oxide of silicon layer or the like, is formed. In some embodiments, the interlayer dielectric layer 303 (if any) may also cover the gate 332'.

Figure 3F:
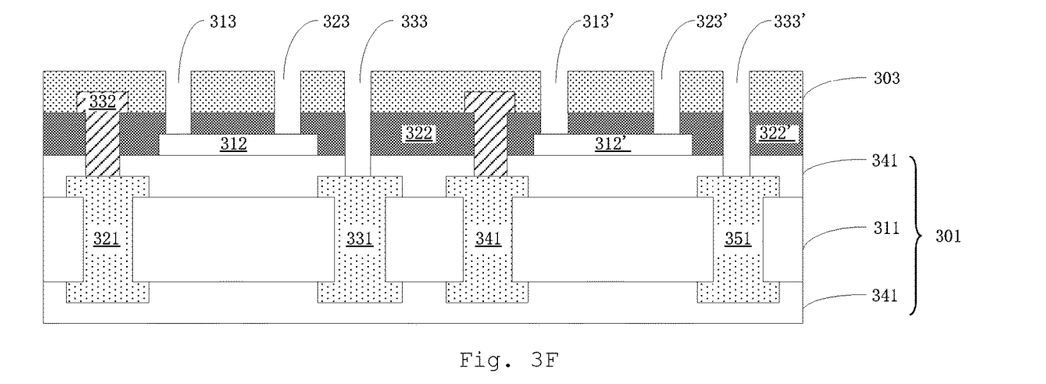

Thereafter, as shown in FIG. 3F, a via 313 and a via 323 that penetrate through the interlayer dielectric layer 303 and the gate insulating layer 322, and a via 333 that penetrates through the interlayer dielectric layer 303, the gate insulating layer 322, and the insulating protective layer 341 are formed.

In some embodiments, a via 313' and a via 323' that penetrate through the interlayer dielectric layer 303 and the gate insulating layer 322', and a via 333' that penetrates through the interlayer dielectric layer 303, the gate insulating layer 322', and the insulating protective layer 341 may also be formed.

In one or more embodiments, a first via and a second via that penetrate through the gate insulating layer 322 may be formed first after the gate insulating layer 322 is formed, and a third via communicating with the first via and a fourth via communicating with the second via are then formed after the interlayer dielectric layer 303 is formed, thereby a via 313 and a via 323 are obtained. The via 313' and the via 323' may also be formed in a similar manner, and will not be described in detail here. In one or more embodiments, the via 333 and the via 333' may also be formed in a similar manner.

Figure 3G:
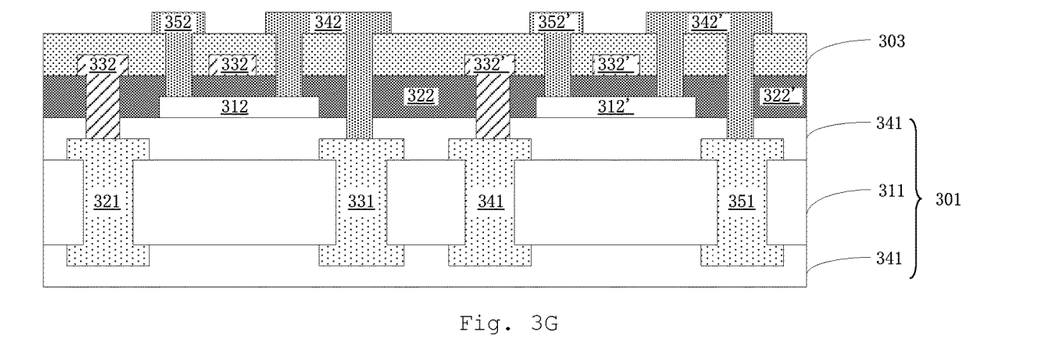

Thereafter, as shown in FIG. 3G, a source 342 connected to the active layer 312 and the fourth connecting member 331, and a drain 352 connected to the active layer 312 are formed. In some embodiments, a source 342' connected to the active layer 312' and the sixth connecting member 351, and a drain 352' connected to the active layer 312' may also be formed.

Figure 3H:
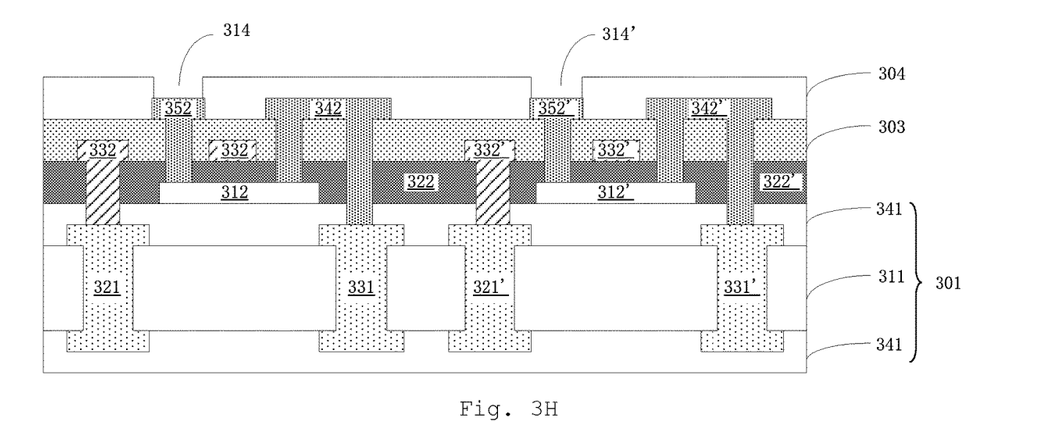

Thereafter, as shown in FIG. 3H, a planarization layer 304 such as a resin material layer is formed on the structure shown in FIG. 3G. The planarization layer 304 defines an opening 314 that exposes at least a part of the drain 352. In some embodiments, the planarization layer 304 also defines an opening 314' that exposes at least a part of the drain 352'.

Figure 3I:
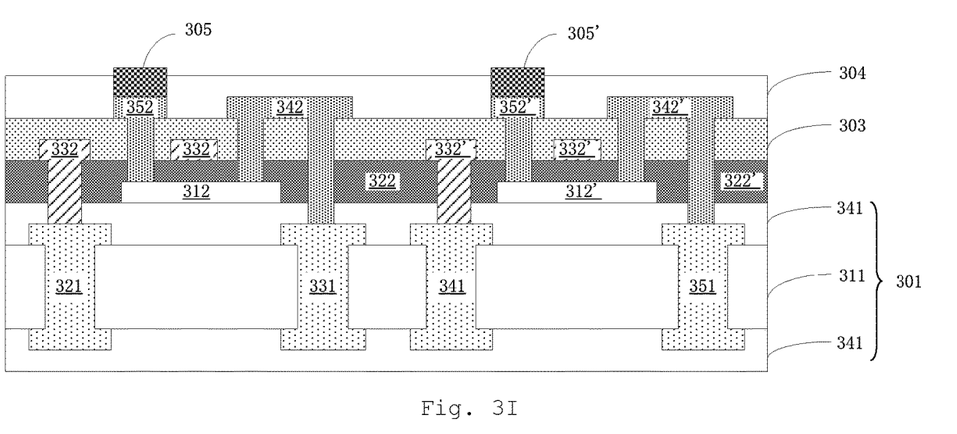

Thereafter, as shown in FIG. 3I, a contact electrode 305 filling the opening 314 is formed. In some embodiments, a contact electrode 305' filling the opening 314' may also be formed. The materials of the contact electrode 305 and the contact electrode 305' may be, for example, a metal material such as tin.

A second backplane may be formed according to the flow shown in FIGS. 3A-3I, and the second backplane is referred to as a second backplane 300 below. After the first backplane 200 shown in FIG. 2I and the second backplane 300 shown in FIG. 3I are formed, the second backplane 300 may be attached to a surface of the first substrate 200 facing away from the first thin film transistor 202, thereby a display backplane shown in FIG. 4 is obtained.

For example, an opening may be formed at a position of the insulating protective layer 241 on a surface of the first substrate 200 facing away from the first thin film transistor 202 that corresponds to the connecting member (for example, the first connecting member 221 or the second connecting member 231) in the first backplane 200 to expose at least a part of the connecting member. Then, the contact electrode (e.g., the contact electrode 305 or the contact electrode 305') in the second backplane 300 is aligned with the connecting member in the first backplane 200. Then, a certain pressure is applied to at least one of the first backplane 200 or the second backplane 300 within a certain temperature range to make the contact electrode (e.g., the contact electrode 305 or the contact electrode 305') contact and bond with the connecting member (e.g., the first connecting member 221 or the second connecting member 231). Thus, the second backplane 300 may be pressed to attach to a surface of the first substrate 200 facing away from the first thin film transistor 202. It should be understood that, during the press process, the contact electrode 305 and the first connecting member 221 are mutually diffused to be bonded together by an intermolecular bonding force. Similarly, the contact electrode 305' and the second connecting member 231 are mutually diffused to be bonded together by an intermolecular bonding force.

In some embodiments, a material of the contact electrode (e.g., the contact electrode 305 in contact with the drain 352) in the second backplane 300 may be Sn—Ag—Cu alloy or In—Sn alloy. In this case, a pressure of less than 100 kPa may be applied to at least one of the first backplane 200 or the second backplane 300 within a temperature ranging from 160° C. to 200° C. (e.g., 170° C., 180° C., etc.) to press the second backplane 300 to attach to the surface of the first substrate 200 facing away from the first thin film transistor 202. In such a press manner, neither damages of the first substrate 201 and the second substrate 301 under pressure are tended to be caused, nor the performances of the first thin film transistor 202 and the second thin film transistor 302 (302') are adversely affected due to an excessively high temperature.

Figure 4:
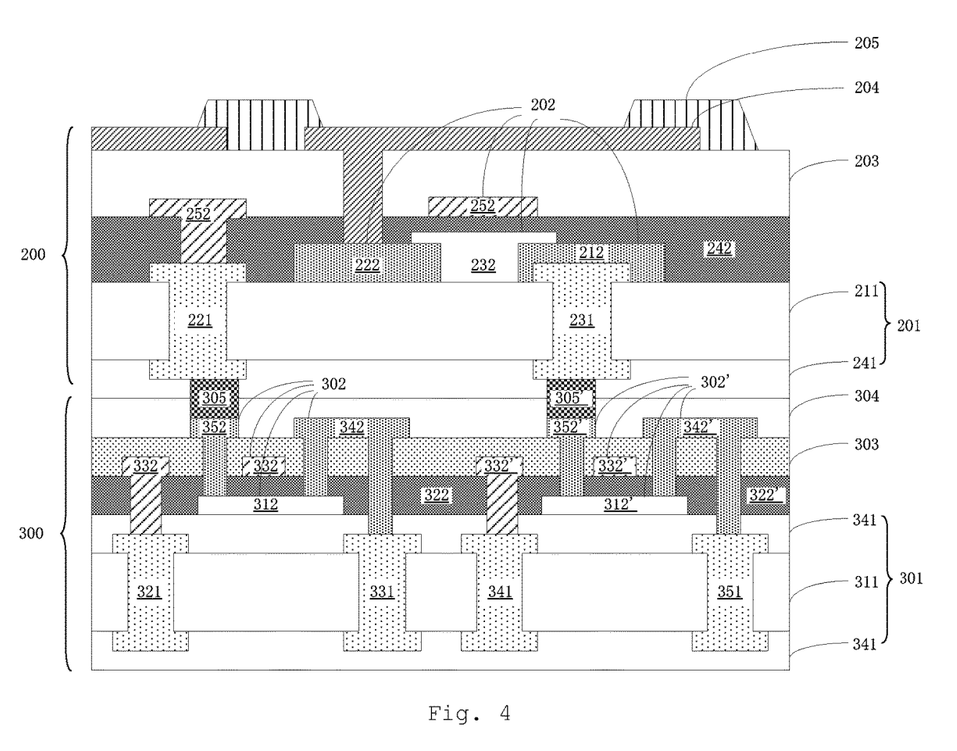
FIG. 4 is a schematic structural view showing a display back panel according to an embodiment of the present disclosure.

FIG. 4 is a schematic structural view showing a display back panel according to an embodiment of the present disclosure. As shown in FIG. 4, the display backplane comprises a first backplane 200 and a second backplane 300.

The first backplane 200 comprises a first substrate 201, and a first thin film transistor 202, on the first substrate 201, configured to drive the light emitting unit. It should be understood that, the first backplane 200 may also comprise other components such as a planarization layer 203 covering the gate 252, an anode 204 on the planarization layer 203 and connected to the drain 222, or the like.

The second backplane 300 comprises a second substrate 301 and at least one second thin film transistor, for example, a second thin film transistor 302 (302'). The second thin film transistor 302 (302') is located between the second substrate 301 and the first substrate 201. The second backplane 300 is attached (for example, adhered or bonded) to a surface of the first substrate 201 that faces away from the first thin film transistor 202.

In some embodiments, the material of the active layer 232 of the first thin film transistor 202 is different from that of the active layer 312 (312') of the second thin film transistor 302 (302'). For example, the material of the active layer 232 of the first thin film transistor 202 comprises an oxide semiconductor, and the material of the active layer 312 (312') of the second thin film transistor 302 (302') comprises a polysilicon. In other embodiments, the material of the active layer 232 of the first thin film transistor 202 is the same as that of the active layer 312 (312') of the second thin film transistor 302 (302').

In some embodiments, the second thin film transistor 302 (302') is comprised in a driving circuit. For example, the driving circuit may comprise at least one of a gate driving circuit or a source driving circuit. In some embodiments, the second thin film transistor 302 (302') may also be comprised in another circuit.

Here, although the second backplane 300 shown in FIG. 4 comprises the second thin film transistor 302 of the gate driving circuit and the second thin film transistor 302' of the source driving circuit, it should be understood that, this is not restrictive. For example, the second backplane 300 may only comprise at least one of a plurality of second thin film transistors of a certain driving circuit. That is to say, for a certain driving circuit, some of the second thin film transistors of the driving circuit may be disposed in the second backplane 300, or all the second thin film transistors of the driving circuit may be disposed in the second backplane 300.

In addition, it should be noted that, FIG. 4 only schematically shows the second thin film transistor 302 connected to the first backplane 200 in the gate driving circuit, and the second thin film transistor 302' connected to the first backplane 200 in the source driving circuit, but does not show other second thin film transistors in the gate driving circuit and the source driving circuit.

In the above embodiments, the second backplane comprising at least one second thin film transistor and the first backplane comprising the first thin film transistor configured to drive the light emitting unit are stacked to be attached together. Such display backplane helps to reduce the size of the frame of the display panel.

In some embodiments, the first substrate 201 comprises a first substrate layer 211, and at least one of a first connecting member 221 or a second connecting member 231 that penetrate through the first substrate layer 211.

In some implementations, the gate 252 of the first thin film transistor 202 is connected to the drain of one of the at least one second thin film transistor via the first connecting member 221, for example, connected to the drain 352 of the second film transistor 302 of the gate driving circuit.

In other implementations, the source 212 of the first thin film transistor 202 is connected to the drain of one of the at least one second thin film transistor via the second connecting member 231, for example, connected to the drain 352' of the second film transistor 302' of the source driving circuit.

In still other implementations, the gate 252 of the first thin film transistor 202 is connected to the drain of one of the at least one second thin film transistor (e.g., the second thin film transistor 302 of the gate driving circuit) via the first connecting member 221, and the source 212 of the first thin film transistor 202 is connected to the drain of another one of the at least one second thin film transistor (e.g., the second thin film transistor 302' of the source driving circuit) via the second connecting member 231.

In the above embodiments, the first thin film transistor is connected to the second thin film transistor via a connecting member in the first substrate. In such display backplane, no additional peripheral leads are needed to connect the second thin film transistor to the first thin film transistor, which helps to further reduce the size of the frame of the display panel.

In some embodiments, the first substrate 201 further comprises an insulating protection layer 241 on one side of the first substrate layer 211 facing away from the first thin film transistor, and the second backplane 300 further comprises a planarization layer 304 on one side of the at least one second thin film transistor (202 or 202) facing away from the second substrate 301.

In some implementations, the first connecting member 221 may be connected to the drain of one of the at least one second thin film transistor via the contact electrode 305 penetrating through the insulating protective layer 241 and the planarization layer 304.

In other implementations, the second connecting member 221' may be connected to the drain of one of the at least one second thin film transistor via the contact electrode 305' penetrating through the insulating protective layer 241 and the planarization layer 304.

In still other implementations, the first connecting member 221 may be connected to the drain of one second thin film transistor 302 of the gate driving circuit via one contact electrode 305 penetrating through the insulating protective layer 241 and the planarization layer 304, and the second connecting member 221' may be connected to the drain of one second thin film transistors 302' of the source driving circuit via another contact electrode 305' penetrating through the insulating protective layer 241 and the planarization layer 304.

In some embodiments, the second substrate 300 comprises a second substrate layer 301 and a plurality of connecting members penetrating through the second substrate layer 301 such as a third connecting member 321, a fourth connecting member 331, a fifth connecting member 341 and a sixth connecting member 351. One or more of the at least one second thin film transistor are connected to an external circuit via a plurality of connecting members. It should be understood that, in a case where a plurality of second thin film transistors are connected to an external circuit via a plurality of connecting members, each of the plurality of second thin film transistors is connected to the external circuit via more than one of the plurality of connecting members. For example, the second thin film transistor of the gate driving circuit is connected to the external circuit via some of the plurality of connecting members, and the second thin film transistor of the source driving circuit is connected to the external circuit via other connecting members of the plurality of connecting members. In some embodiments, the above external circuit may comprise, but is not limited to, a control circuit, a touch circuit, or the like.

For example, the second thin film transistor 302 of the gate driving circuit is connected to the external circuit via the third connecting member 321 and the fourth connecting member 331, and the second thin film transistor 302' of the source driving circuit is connected to the external circuit via the fifth connecting member 341 and the sixth connecting member 351. In some examples, the gate 332 of the second thin film transistor 302 of the gate driving circuit is connected to the external circuit via the third connecting member 321, and the source 342 of the second thin film transistor 302 of the gate driving circuit is connected to the external circuit via the fourth connecting member 331. In some examples, the gate 332' of the second thin film transistor 302' of the source driving circuit is connected to the external circuit via the fifth connecting member 341, and the source 342' of the second thin film transistor 302' of the source driving circuit is connected to the external circuit via the six connecting member 351.

In the above embodiments, the second substrate may be connected to the external circuit via the connecting members in the second substrate, which helps to further reduce the size of the frame of the display panel, for example, reduce the size of the frame around the display panel.

It should be noted that, the positions of the connecting members in the first substrate 200 and the second substrate 300 may be configured according to actual needs. In the following, the second substrate 300 is taken as an example to provide two configuration manners of the connecting members.

Figure 5A:
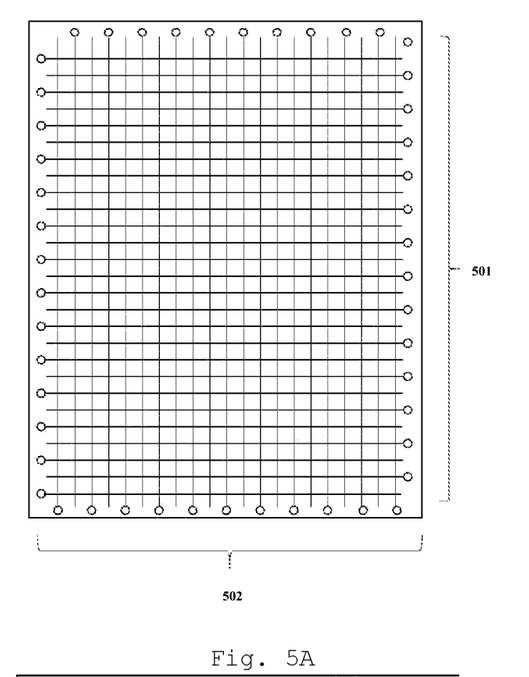
FIG. 5A is a schematic view showing a position of a connecting piece in a second substrate according to an embodiment of the present disclosure.
Figure 5B:
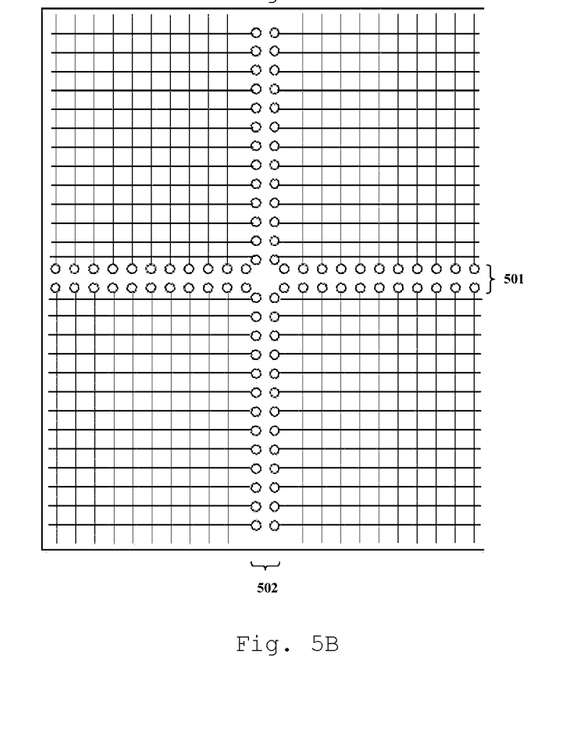
FIG. 5B is a schematic view showing a position of a connecting piece in a second substrate according to another embodiment of the present disclosure.

FIG. 5A is a schematic view showing a position of a connecting piece in a second substrate according to an embodiment of the present disclosure. FIG. 5B is a schematic view showing a position of a connecting piece in a second substrate according to another embodiment of the present disclosure. In FIGS. 5A and 5B, the positions shown by the circles are the positions of the connecting members.

As shown in FIG. 5A, a connecting member 501 connected to the gate driving circuit and a connecting member 502 connected to the source driving circuit may be disposed at a peripheral region of the second substrate layer 311. For example, the connecting members 501 that are vertically arranged are connecting members connected to the gate driving circuit, and the connecting members 502 that are horizontally arranged are connecting members connected to the source driving circuit.

As shown in FIG. 5B, the connecting members 501 connected to the gate driving circuit and the connecting members 502 connected to the source driving circuit may be disposed at an intermediate region of the second substrate layer 311. For example, the connecting members 501 that are horizontally arranged are connecting members connected to the gate driving circuit, and the connecting members 502 that are vertically arranged are connecting members connected to the source driving circuit.

Figure 6:
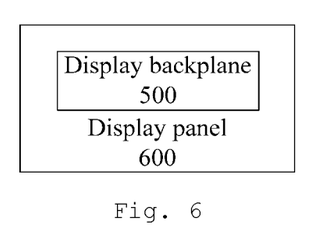
FIG. 6 is a schematic structural view showing a display panel according to an embodiment of the present disclosure.

FIG. 6 is a schematic structural view showing a display panel according to an embodiment of the present disclosure.

As shown in FIG. 6, the display panel 600 may comprise the display backplane 500 according to any one of the above embodiments.

Figure 7:
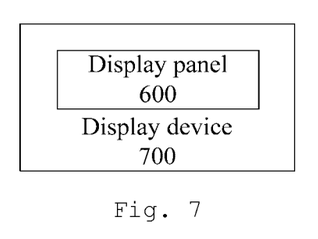
FIG. 7 is a schematic structural view showing a display device according to an embodiment of the present disclosure.

FIG. 7 is a schematic structural view showing a display device according to an embodiment of the present disclosure.

As shown in FIG. 7, the display device 700 may comprise the display panel 600 according to any one of the above embodiments. In some embodiments, the display device may be any product or member having a display function such as a mobile terminal, a television, a display, a notebook computer, a digital photo frame, a navigator, or electronic paper.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features can be made without departing from the scope and spirit of the present disclosure. The scope of the disclosure is defined by the following claims.

What is claimed is:

1. A display backplane, comprising:
a first backplane, comprising:
a first substrate, the first substrate comprising a first substrate layer and a first connecting member penetrating through the first substrate layer, and
a first thin film transistor, on the first substrate, configured to drive a light emitting unit; and
a second backplane attached to a surface of the first substrate facing away from the first thin film transistor, comprising:
a second substrate, and
at least one second thin film transistor located between the second substrate and the first substrate,
wherein a gate of the first thin film transistor is connected to a drain of one of the at least one second thin film transistor via the first connecting member.

2. The display backplane according to claim 1, wherein a material of an active layer of the first thin film transistor is different from a material of an active layer of the at least one second thin film transistor.

3. The display backplane according to claim 2, wherein the material of the active layer of the first thin film transistor comprises an oxide semiconductor, and the material of the active layer of the at least one second thin film transistor comprises a polysilicon.

4. The display backplane according to claim 1, wherein:
the first substrate further comprises an insulating protective layer located on one side of the first substrate layer facing away from the first thin film transistor, and the second backplane further comprises a planarization layer on one side of the at least one second thin film transistor facing away from the second substrate; and
the first connecting member is connected to the drain via a contact electrode penetrating through the insulating protective layer and the planarization layer.

5. The display backplane according to claim 1, wherein:
the first substrate comprises a first substrate layer and a second connecting member penetrating through the first substrate layer; and
a source of the first thin film transistor is connected to a drain of one of the at least one second thin film transistor via the second connecting member.

6. The display backplane according to claim 5, wherein:
the first substrate further comprises an insulating protective layer located on one side of the first substrate layer facing away from the first thin film transistor, and the second backplane further comprises a planarization layer on one side of the at least one second thin film transistor facing away from the second substrate; and
the second connecting member is connected to the drain via a contact electrode penetrating through the insulating protective layer and the planarization layer.

7. The display backplane according to claim 1, wherein:
the second substrate comprises a second substrate layer and a plurality of connecting members penetrating through the second substrate layer; and
one or more of the at least one second thin film transistor are connected to an external circuit via the plurality of connecting members.

8. The display backplane according to claim 7, wherein the plurality of connecting members is disposed at a peripheral region of the second substrate layer.

9. The display backplane according to claim 1, wherein the at least one second thin film transistor is comprised in a driving circuit.

10. The display backplane according to claim 9, wherein the driving circuit comprises at least one of a gate driving circuit or a source driving circuit.

11. The display backplane according to claim 1, wherein:
the first substrate comprises a first substrate layer, and a first connecting member and a second connecting member that penetrate through the first substrate layer; and
a gate of the first thin film transistor is connected to a drain of one of the at least one second thin film transistor via the first connecting member, and a source of the first thin film transistor is connected to a drain of another one of the at least one second thin film transistor via the second connecting member.

12. The display backplane according to claim 11, wherein the one of the at least one second thin film transistor is comprised in a gate driving circuit, and the another one of the at least one second thin film transistor is comprised in a source driving circuit.

13. The display backplane according to claim 12, wherein:
the first substrate further comprises an insulating protective layer located on one side of the first substrate layer facing away from the first thin film transistor, and the second backplane further comprises a planarization layer on one side of the at least one second thin film transistor facing away from the second substrate; and
the first connecting member is connected to the drain of the one of the at least one second thin film transistor via one contact electrode penetrating through the insulating protective layer and the planarization layer, and the second connecting member is connected to the drain of the another one of the at least one second thin film transistor via another contact electrode penetrating through the insulating protective layer and the planarization layer.

14. A display panel, comprising: the display backplane according to claim 1.

15. A display device, comprising: the display panel according to claim 14.

16. A method for manufacturing a display backplane, comprising:
- forming a first backplane, comprising forming, on a first substrate, a first thin film transistor configured to drive a light emitting unit, the first substrate comprising a first substrate layer and a connecting member penetrating through the first substrate layer;
- forming a second backplane, comprising forming at least one second thin film transistor on a second substrate; and
- attaching the second backplane to a surface of the first substrate facing away from the first thin film transistor, wherein after the attaching, the at least one second thin film transistor is located between the second substrate and the first substrate,
- wherein one of a gate and a source of the first thin film transistor is connected to a drain of one of the at least one second thin film transistor via the connecting member.

17. The method according to claim 16, wherein a material of an active layer of the first thin film transistor is different from a material of an active layer of the second thin film transistor.

18. The method according to claim 16, wherein:
- the first substrate comprises an insulating protective layer located on one side of the first substrate layer facing away from the first thin film transistor;
- the second backplane further comprises a planarization layer on one side of the at least one second thin film transistor facing away from the second substrate and a contact electrode penetrating through the planarization layer, wherein the contact electrode is in contact with the drain of the one of the at least one second thin film transistor;
- the attaching comprises:
  - forming an opening at a position of the insulating protective layer corresponding to the connecting member to expose at least a part of the connecting member;
  - aligning the contact electrode with the connecting member; and
  - applying a pressure to at least one of the first backplane or the second backplane to make the contact electrode contact and bond with the connecting member.

19. The method according to claim 18, wherein a material of the contact electrode comprises Sn—Ag—Cu alloy or In—Sn alloy;
- the applying comprises:
  - applying the pressure of less than 100 kPa within a temperature ranging from 160° C. to 200° C.

20. A display backplane, comprising:
- a first backplane, comprising:
  - a first substrate, the first substrate comprising a first substrate layer and a second connecting member penetrating through the first substrate layer, and
  - a first thin film transistor, on the first substrate, configured to drive a light emitting unit; and
- a second backplane attached to a surface of the first substrate facing away from the first thin film transistor, comprising:
- a second substrate, and
- at least one second thin film transistor located between the second substrate and the first substrate,
- wherein a source of the first thin film transistor is connected to a drain of one of the at least one second thin film transistor via the second connecting member.

* * * * *